(12) United States Patent
Pennock

(10) Patent No.: US 7,301,401 B2
(45) Date of Patent: *Nov. 27, 2007

(54) LOW NOISE OP AMP

(75) Inventor: John L. Pennock, Midlothian (GB)

(73) Assignee: Wolfson Microelectronics plc, Edinburgh (GB)

( * ) Notice: Subject to any disclaimer, the term of this patent is extended or adjusted under 35 U.S.C. 154(b) by 137 days.

This patent is subject to a terminal disclaimer.

(21) Appl. No.: 11/267,330

(22) Filed: Nov. 7, 2005

(65) Prior Publication Data

US 2006/0109055 A1     May 25, 2006

Related U.S. Application Data

(63) Continuation-in-part of application No. 10/837,779, filed on May 4, 2004, now Pat. No. 7,113,042.

(30) Foreign Application Priority Data

Mar. 16, 2004  (GB)  .................. 0405872.3
Jan. 18, 2005  (GB)  .................. 0501029.3

(51) Int. Cl.
*H03F 3/16*      (2006.01)

(52) U.S. Cl. ...................... 330/277; 330/253

(58) Field of Classification Search ............... 330/277, 330/253, 298, 209 P, 311

See application file for complete search history.

(56) References Cited

U.S. PATENT DOCUMENTS

| 5,696,459 | A | 12/1997 | Neugebauer et al. |
| 5,729,178 | A | 3/1998 | Park |
| 6,486,821 | B1 | 11/2002 | Aude et al. |
| 6,504,433 | B1 * | 1/2003 | Weber et al. ............... 330/277 |
| 6,657,495 | B2 | 12/2003 | Ivanov et al. |
| 2001/0040259 | A1 | 11/2001 | Shiiki et al. |
| 2003/0155976 | A1 | 8/2003 | Weber et al. |
| 2003/0219111 | A1 | 11/2003 | Frey |

FOREIGN PATENT DOCUMENTS

| GB | 2322042 | 12/1996 |
| GB | 2 396 983 A | 7/2004 |
| JP | 2000-236226 | 8/2000 |

* cited by examiner

*Primary Examiner*—Henry Choe
(74) *Attorney, Agent, or Firm*—Dickstein Shapiro LLP

(57) ABSTRACT

An analog circuit for processing analog signals in an integrated circuit comprising a number of metal oxide semiconductor transistor devices. The circuit includes a first transistor device having a thin oxide thickness, and a second transistor device having a thicker oxide thickness. A voltage pulse protection is arranged to maintain the operating voltage of the thin oxide transistor in the presence of a rapidly rising voltage waveform (e.g. ESD), or at least to mitigate its effect on the thin oxide transistor device. Preferably a cascode based op amp structure is implemented.

18 Claims, 12 Drawing Sheets

LOW NOISE OP AMP

This is a continuation-in-part of U.S. application Ser. No. 10/837,779, filed May 4, 2004, now U.S. Pat. No. 7,113,042 the disclosure of which is incorporated by reference herein.

BACKGROUND OF THE INVENTION

1. Field of the Invention

The present invention relates to amplifiers using metal oxide semiconductor based integrated circuits. The present invention is particularly but not exclusively related to audio application mixed signal chips.

2. Description of the Related Art

Due to the increasing need for miniaturisation of portable devices such as MP3 players, mobile telephones and personal digital assistants, it has become increasingly important to implement both digital processing functions and related analog, especially audio, processing functions on the same chip or integrated circuit—a so called mixed signal chip. For this reason the implementation of analog functions on metal oxide semiconductor (MOS) based devices has become increasingly important.

A major problem with this technology however is that the digital and analog circuits require different characteristics from the same semiconductor technology. Digital circuits are fastest and consume least power and chip area when implemented using the shortest channel available in a given manufacturing technology. However this limits the supply voltage that can be applied to this digital circuitry without causing breakdown or premature wear-out of the small devices used. For example digital circuitry on a currently mature process might use a structure with 0.35 um drain-source spacing and 70 nm gate oxide thickness. However most analog circuits must operate in accordance with legacy standards, for example in order to provide a 2V rms signal for consumer standard audio Line Outputs, or possibly 5V rms for professional applications. Operation at these large signal swings is likely to continue to be necessary for some time in the future, to maintain the ratio of signal power to that of the thermal noise of the op amps and resistors in the signal path: a halving of the signal amplitude would require the noise power to be divided by four, reducing the required circuit impedances by a factor of four, and increasing the power required by the amplifiers, despite the lower supply voltage. Also reducing the signal level would increase the relative importance of extraneous noise and interference coupling into the circuitry. This is likely to require a rail to rail supply as high as 18V. To avoid large electric fields in the device, which cause breakdown or long-term reliability issues such as hot-carrier induced degradation of threshold voltage and transconductance, this requires a larger device structure, with typically a 3 um minimum drain-source spacing and a 350 nm oxide layer thickness.

Many widely available semiconductor manufacturing technologies today offer the possibility of selecting a thin or thick gate oxide thickness for selected transistors in each integrated circuit on the basis of additional photographic masking and processing steps. For instance one technology allows 70 nm gate oxides for 3.3V nominal (3.6V maximum) operation for core logic transistors, but 120 nm devices for 5V nominal (5.5V maximum) digital input and output devices. Such technology has been used for mixed signal circuits where the logic operates at 3.3V and all the analog circuitry operates at 5V. Similarly circuits such as LCD display drivers use 3.3V control logic and 18V nominal (19.8V maximum) (350 nm gate oxide) output stages. Allowing the logic to operate at lower voltage using smaller devices makes these devices smaller in chip area and hence cost and reduces the power consumed by the digital circuitry.

High performance audio op amps also require high open loop bandwidth so that the distortion inherent in their open-loop transfer characteristics may be suppressed across the audio band by negative feedback around the amplifier, even when this feedback is relatively light, to provide gain in the signal path. Suppression of distortion is important even at frequencies well above the human hearing limit of approximately 20 kHz. This is because distortion at these higher frequencies, for example up to 100 kHz, have an effect in the audible range (20 Hz-20 kHz). Also audio signals from delta-sigma digital-to-analog converters have quantisation noise components well above the audio band, which can intermodulate to produce audio band components unless the amplifier retains a linear closed-loop response to these high-frequency components. A wide closed-loop bandwidth is also necessary to avoid relative phase delays across the audio spectrum.

One of the major sources of noise in MOS technology is flicker noise. MOS devices such as transistors contain traps, due to impurities and inevitable imperfections in the crystal structure of the silicon, in or near the interface between the silicon and silicon oxide layers. The current in MOS devices typically travels substantially along this interface, and the traps charge and discharge randomly over time. This gives rise to a noise component of charge density at the oxide interface with an approximately 1/f power spectrum, i.e. with higher spectral density at lower frequencies.

For circuit analysis, this charge variance $\Delta Q$ may be regarded as an equivalent modulation of the gate voltage $\Delta VG$ where $\Delta VG=\Delta Q/Cox$, Cox being the capacitance from gate to channel across the gate oxide. Cox is inversely proportional to gate oxide thickness, so for the same charge variance, the equivalent gate voltage noise is proportional to gate oxide thickness. In practice, this is found to be the case, i.e. similar processes with different gate oxide thicknesses give gate flicker noise voltages increasing with gate oxide thickness.

It is also found that the flicker noise voltage is inversely proportional to the square root of the area of a MOS transistor. So one approach to reducing this noise is to increase the surface area, i.e. to increase the width and length of the transistor. However to improve flicker noise by say 6 dB would require four times the transistor area: significant further improvement in flicker noise rapidly leads to impractically large devices, both in terms of extra parasitic capacitances and in the chip area consumed and hence in cost of manufacture.

The contribution of flicker noise of a given transistor to the input-referred noise voltage of an amplifier can also be reduced by altering the gain from the transistor referred to the input, by altering its aspect ratio or altering its bias current. But this makes the design deviate from what would otherwise be considered the optimum in terms of the desired combination of area, power, and performance, and in practice there is again only a small improvement practically achievable without unduly compromising other design objectives.

Also chopper-stabilisation techniques could be incorporated to move flicker noise away to higher frequencies, where the noise can either be ignored or filtered out. However this adds to the complexity of the circuit, generally requiring the addition of multiple switches and clock generation and distribution circuitry, and tends to give spurious output signals at the chopping frequency and its harmonics.

So in general, for a given circuit topology, circuit specification, and manufacturing technology, there is a practical and economical lower limit to the flicker noise achievable.

A known circuit common in high performance audio amplifier applications is the differential folded cascode op amp circuit, a schematic for which is shown in FIG. 1a. This circuit offers low distortion, high gain, and wide bandwidth, which are desirable for hi fidelity sound reproduction. The operation of such circuits is well known to those skilled in the art, however the cascode arrangement essentially utilises a gain transistor (MP1 or MP2) together with a cascode transistor (MNC1 or MNC2) which effectively reduces the variation in voltage across its associated gain transistor (MP1 or MP2) in order for this to amplify changes in its input voltage in a linear fashion; thus reducing distortion. This topology also offers high voltage gain to the output Iout and wide voltage compliance at this node, either for directly driving an output or to act as the input of a further op amp gain stage.

FIG. 1a shows a differential folded cascode amplifier structure using two cascode transistors (MNC1, MNC2) and constant current bias devices MNM1, MNM2. Since bias device MNM2 passes a constant current, all signal current from input device MP2 passes through cascode device MNC2 to the output Iout. Similarly, signal current from MP1 passes through cascode device MNC1 rather than bias device MNM1, and is then mirrored by mirror devices MPB1, MPB2 to the output Iout. Cascode devices MPC1 and MPC2 are inserted in series with the drains of MPB1, MPB2 to improve the output impedance and accuracy of this current mirror. Suitable bias voltages VCP1, VCN1, VBN1 are derived by other circuitry using standard techniques.

The folded cascode structure of FIG. 1b is a variation of this differential folded cascode amplifier. In this case previous bias devices MNM1 and MNM2 are reconnected as mirror devices with MNM1 being drain-gate connected, and cascode device MNC1 is also drain-gate connected, and previous mirror devices MPB1 and MPB2 now operate as constant bias current sources supplied with a suitable bias voltage VBP1. As before, signal current from MP2 flows through cascode device MNC2 to the output. However signal current from MP1 can no longer flow through cascode device MNC1, since this is now forced to operate at the constant current supplied by MPB1, so this signal current now flows though mirror device MNM1, where it is mirrored by MNM2 and thence flows through MNC2 to the output.

Whilst in these structures the flicker noise contribution of the cascode transistors MNC1, MNC2, MPC1 and MPC2 is small, in practical implementations of the circuits of FIG. 1a or FIG. 1b, it is found that the flicker noise contributed by MNM1 and MNM2 is one of the dominant components of audio frequency noise, with other flicker noise contributed by input devices MP1 and MP2 and by MPB1 and MPB2. This is particularly the case for high-voltage (say 18V) circuits where the amplifier is implemented with appropriately thick gate oxide (say 350 nm) MOS devices. As discussed above, the designer soon reaches a practical lower limit for this flicker noise. Yet there is an increasing requirement for lower and lower noise audio circuitry with better and better signal-to-noise ratio, i.e. lower noise and higher signal swings.

SUMMARY OF THE INVENTION

In general terms the present invention provides an analog circuit arrangement using MOS based technology which reduces flicker noise by reducing the oxide thickness of selected transistor devices, having a low operating voltage, compared with those required to operate with a larger operating voltage in the same circuit. The lower voltage transistors are typically employed for biasing, constant current sources, and current mirrors, whereas the larger voltage transistors are exposed to the necessary large signal swings for hi fidelity audio operation. The reduced oxide thickness reduces the flicker noise contribution to the circuit from these low voltage transistors, and hence the overall flicker noise of the circuit. The cascode transistor(s) will still require a thicker oxide layer in order to handle the higher voltage level, whereas the other circuit transistors can be implemented with thinner oxide layers by arranging the circuit such that they are only required to handle relatively low operating voltages.

Advantageously, this dual transistor oxide thickness arrangement can be utilised in a folded cascode op amp circuit in which the transistors required to handle the larger voltages are the cascode transistors, which because of the nature of cascode circuits have a much reduced flicker noise contribution compared with transistors in other circuit configurations. Thus a number of the non-cascode circuit transistors can have thinner oxide layers in order to further minimise their contributions to the flicker noise of the op amp circuit.

A further advantage of this arrangement is that the overall chip size can be reduced because of the replacement of thicker oxide layer transistors by thinner oxide transistors. For a given width and length and operating current and voltage, the thinner gate oxide transistor will have high transconductance and higher output impedance: conversely for a given requirement for transconductance or output impedance, the width and length can be scaled, giving a smaller chip area occupied by the transistor. Of course this scaling will also reduce the improvement in flicker noise, but this is a tradeoff available to the designer.

When used in mixed-signal mixed-voltage integrated circuits, where the digital circuitry uses thin-oxide transistors and the analog circuitry uses thick-oxide transistors, there is no incremental cost, either in tooling or actual manufacturing cost in using thin-oxide transistors of the same structure as used in the digital circuitry in selected locations in the analog circuitry.

A disadvantage of the use of thin oxide transistors is that they are more susceptible to damage when expose to electrostatic discharge (ESD) or other high voltage "shocks". Therefore an embodiment provides a voltage pulse protection means arranged to maintain the operating voltage of the thin oxide transistor in the presence of a rapidly rising voltage waveform (eg ESD), or at least to mitigate its effect on the thin oxide transistor device.

The voltage pulse protection means is preferably a discrete device coupled across the thin oxide transistor device(s). A single discrete device may be used for a number of thin oxide transistor devices, although other arrangements including a discrete protection device for each thin oxide transistor device could also be used. Preferably the or each discrete device is a capacitor.

Preferably the thin and thick oxide transistor devices are arranged into a cascode circuit stage and the voltage pulse protection means is coupled across the thin oxide transistor device to the gate connection of the cascode thick oxide transistor device. Preferably the circuit includes a plurality of cascode circuit stages having a common cascode thick oxide transistor device gate connection, and wherein a single discrete device is coupled between the thin oxide transistors and the common gate connection in order to implement the voltage pulse protection means.

In particular in one aspect the present invention provides an analog circuit for processing analog signals in an integrated circuit according to claim 1.

Preferably the first transistor device is arranged in use to have an operating voltage below a predetermined level and the second transistor device is arranged such that in use it is not constrained by this predetermined operating voltage level. This allows the first oxide layer to be thinner than the second oxide layer thickness. For example the predetermined operating voltage level is 3.6V and the first oxide thickness is 70 nm. This compares with an example operating voltage of 19.8V and oxide thickness of 350 nm for the second transistor.

Preferably the second transistor device forms part of a cascode transistor device circuit within said analog circuit. Preferably the cascode transistor device circuit is a differential folded cascode op amp circuit. This reduces the flicker noise contribution of the thicker oxide layer transistors.

Preferably the thin oxide transistors are employed in the input, bias and constant current sub-circuits of the op amp circuit.

The predetermined operating voltage level may be achieved with the use of a clamp circuit for example.

Preferably the analog circuit is integrated in a mixed signal chip, such as a DAC or ADC chip. The circuit may also be utilised in more complex packages such as system on a chip (SoC), or in a MOS based analog only integrated circuit.

There is also provide a method of processing an analog signal comprising applying the analog signal to an analog circuit for processing analog signals in an integrated circuit comprising a number of metal oxide semiconductor transistor devices, the circuit stage comprising a first said transistor device having a first oxide thickness, and a second said transistor device having a second and different oxide thickness.

There is also provide a method of producing an analog circuit for processing analog signals in an integrated circuit; the method comprising providing a number of metal oxide semiconductor transistor devices arranged to implement said circuit stage, at least a first said transistor device having a first oxide thickness, and at least a second said transistor device having a second and different oxide thickness.

Preferably the integrated circuit is a mixed signal circuit having additionally digital circuits, which preferably use transistors employing the thinner of the two oxide thicknesses

BRIEF DESCRIPTION OF THE DRAWINGS

Embodiments will now be described with reference to the following drawings, by way of example only and without intending to be limiting; in which.

DETAILED DESCRIPTION OF THE PREFERRED EMBODIMENTS

Figure 1A:
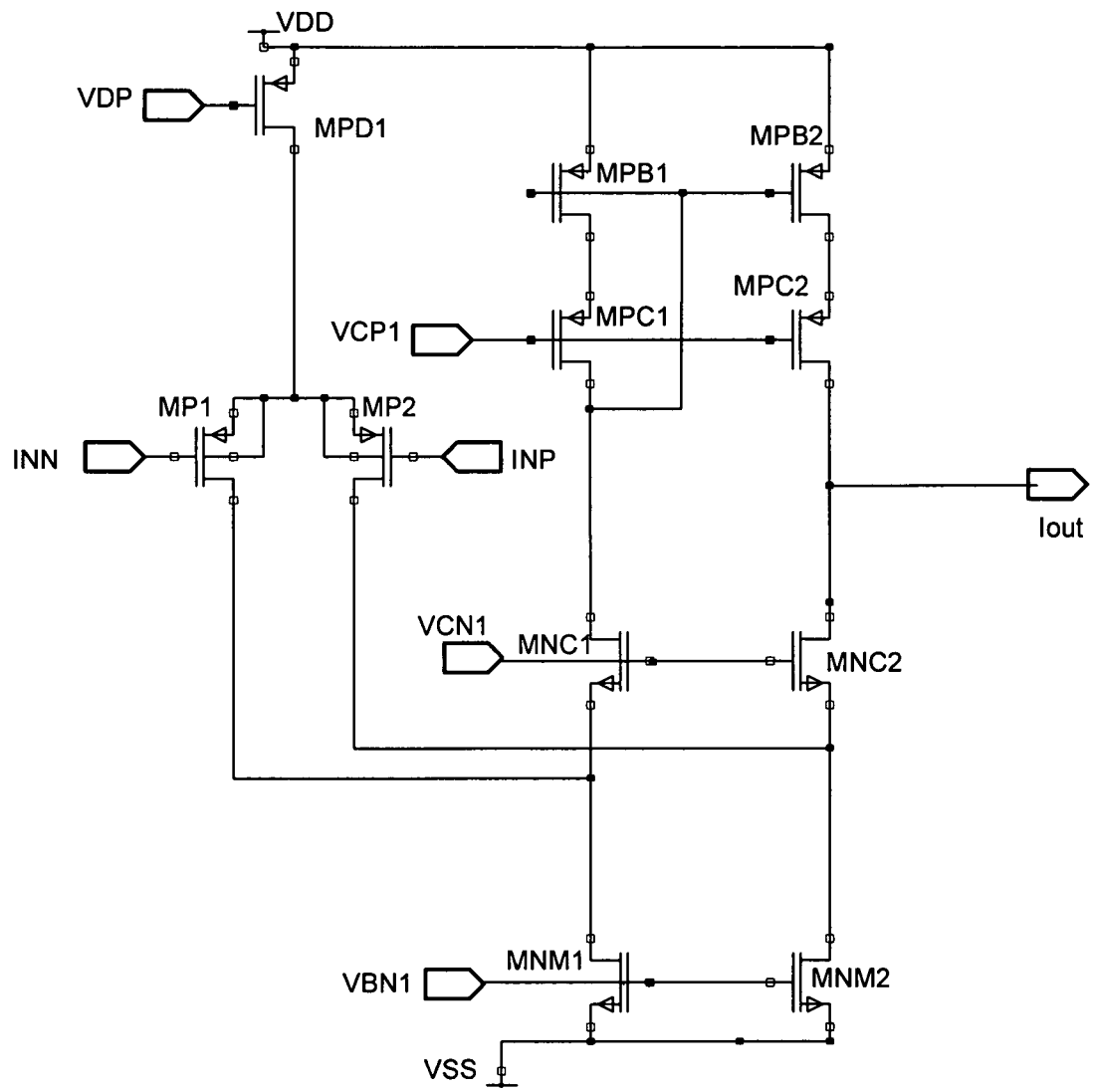
FIG. 1a shows a known differential folded cascode op amp circuit.
Figure 1B:
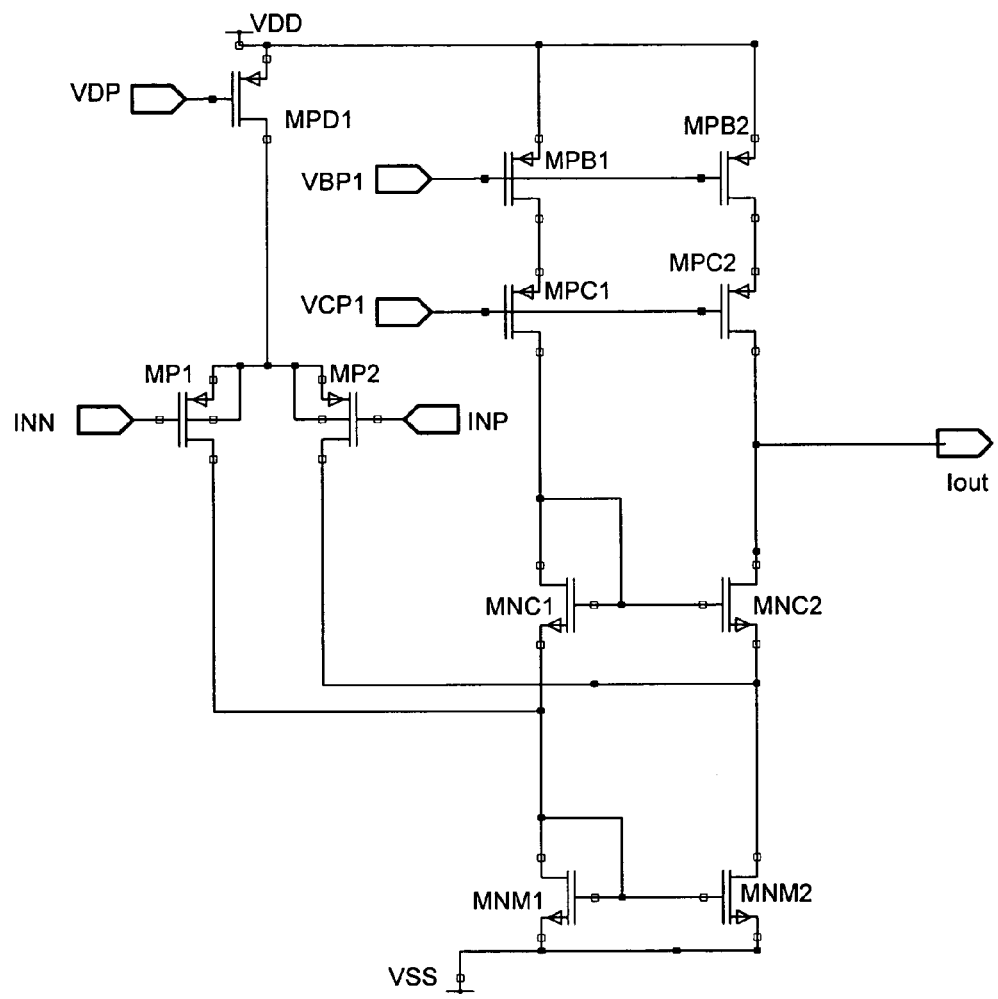
FIG. 1b shows another known differential folded cascode op amp circuit.

Referring initially to FIG. 1b, a typical audio op amp design is shown which utilises a differential folded cascode arrangement. MOS based transistor devices MP1 and MP2 are input transistors. Signal current from MP2 passes through folded cascode device MNC2 to the output. Signal current from MP1 cannot pass through folded cascode device MNC1, since current I(MNC1) is equal to the constant current defined by the constant current source MPB1. The MP1 signal current therefore passes through the current mirror formed by MNM1, MNM2 and then through the cascode device MNC2 to the output. Thus MNM1, MNM2, MNC1, MNC2 act as a single ended to differential converter, as well as contributing a cascode function to increase output impedance of this transconductance stage. Transistors MPC1 and MPC2 serve as cascode devices to bias devices MPB1 and MPB2 to increase their effective output impedance, to maintain the high output impedance at Iout and also to improve power supply rejection.

The supply voltage for this circuit block is typically 18V, and so all the transistor devices are "thick" oxide devices, typically 350 nm. Generally NMOS devices contribute more flicker noise than PMOS devices, so the main source of flicker noise in this circuit is MNM1 and MNM2. However the other non-cascode devices (MP1, MP2, MPB1, MPB2) also contribute some noise. To first order the signal current from the drain terminals of cascode devices MNC1, MNC2, MPC1, MPC2 is equal to that into their respective source terminals, so they can not contribute noise. Second order effects due to their non-zero output conductance and the non-zero output conductance of adjacent devices do allow these devices to generate a small output noise contribution, but this is generally negligible compared to contributions of other devices in the circuit.

Figure 2:
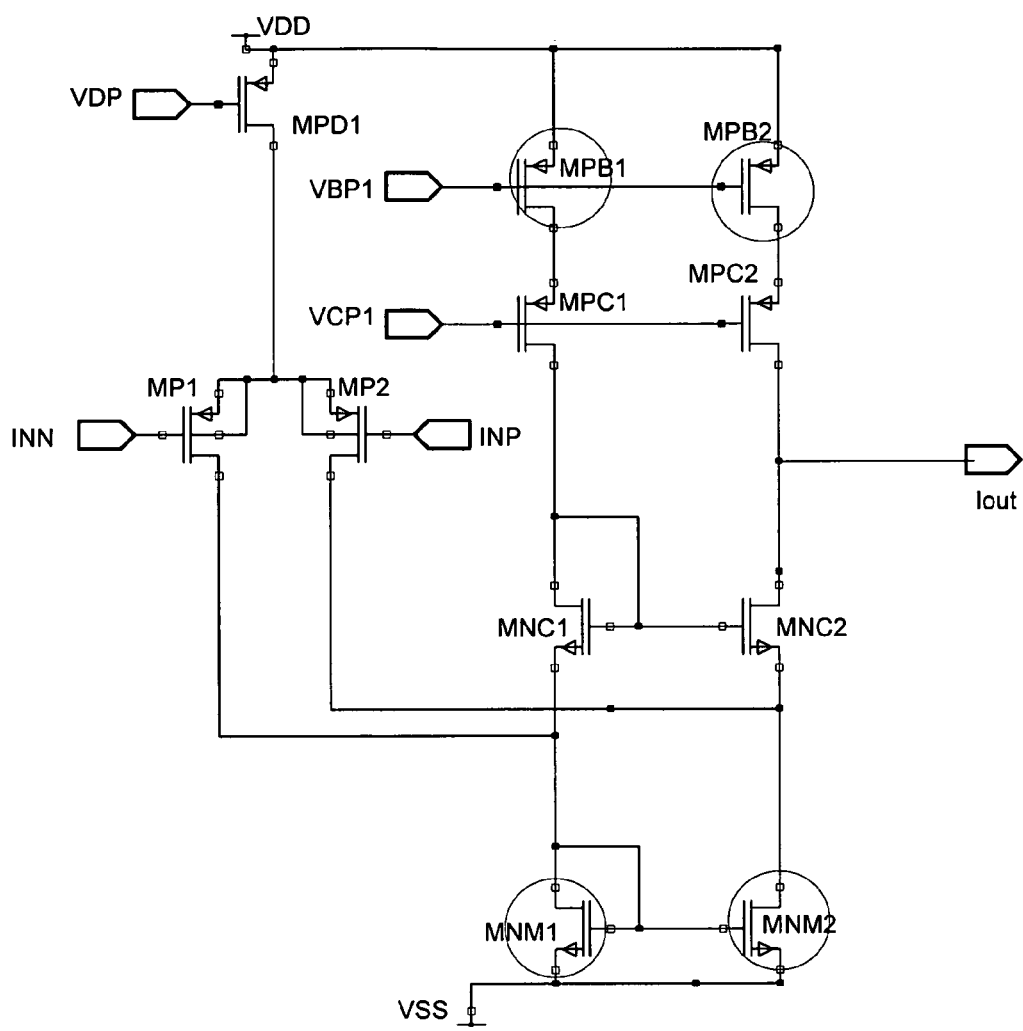
FIG. 2 shows a modified differential folded cascode op amp circuit according to an embodiment.

Referring now to FIG. 2, a differential folded cascode op amp according to an embodiment is shown. This circuit comprises the same elements as the circuit of FIG. 1b, in particular input transistor devices MP1 and MP2 which receive the input signal; input bias transistor MPD1; cascode transistors MNC1 and MNC2; constant current source transistors MPB1 and MPB2, and associated cascode transistors MPC1 and MPC2, as well as current mirror transistors MNM1 and MNM2. The circuit operates in the same manner as the circuit of FIG. 1b, however a number of the transistors (circled) have advantageously a thinner oxide layer than the others.

In particular, transistors MNM1, MNM2, MPB1 and MPB2 have thin, for example 70 nm, oxide layer thicknesses, whereas the cascode transistors MNC1, MNC2, MPC1 and MPC2, as well as the input transistors MP1, MP2 and MPD1 have thick, for example 350 nm, oxide layers thicknesses. The thicker oxide layers allow these transistors to handle the larger operating voltages imposed upon them by the large signal swing requirement. However the thin oxide layer transistors have lower maximum voltages across their drain-source, gate-drain, and gate-source and so can be implemented with thinner oxide layers, thereby reducing their flicker noise contribution to the circuit.

Remaining thick oxide transistors MNC1, MNC2, MPC1 and MPC2 are in cascode configurations so contribute little flicker noise, providing a low noise op amp circuit design. In certain applications, the input transistors MP1 and MP2 may also be made thin oxide, to reduce their flicker noise contribution if the input signals can be "guaranteed" to be within the predetermined operating voltage level, for example 3.6V for a 70 mn oxide layer thickness.

While a differential folded cascode op amp circuit is the preferred arrangement, other amplifier designs can also benefit from the dual transistor device oxide layer thickness approach. For example non-differential, non-folded, and non-cascode amplifier circuits could be implemented using MOS transistor devices having more than one thickness.

Figure 3:
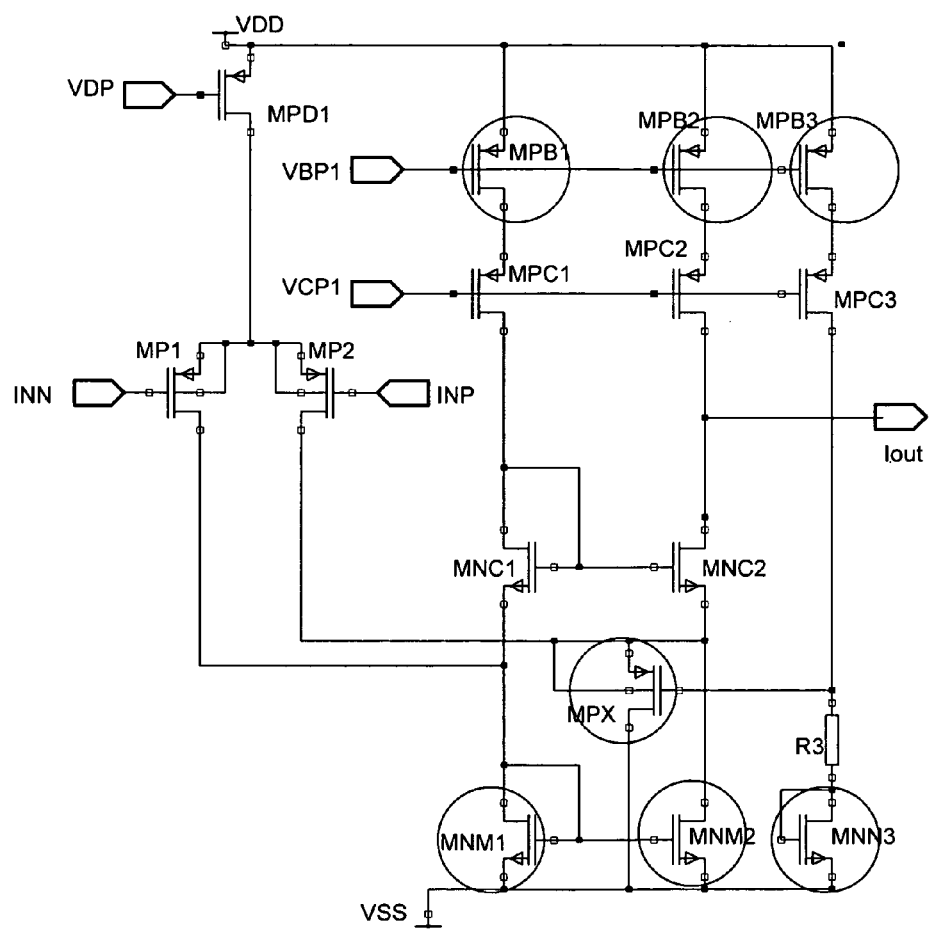
FIG. 3 shows a modified differential folded cascode op amp circuit according to a second embodiment.

FIG. 3 shows an alternative differential folded cascode op amp circuit according to an embodiment. This circuit is similar to that of FIG. 2, but includes additional circuitry to ensure the operating drain-source, gate-drain, and gate-source voltages for the thin oxide transistors remain below the predetermined voltage level (eg 3.6V) even in overload conditions. Current mirror device MNM1 is diode connected and so never sees more current than the sum of bias currents I(MPD1)+I(MPB1). Therefore its drain-source voltage can be designed to be less than 3.6V.

Complementary current mirror device MNM2 is not diode connected, however its gate-source voltage is equal to that of MNM1, and so is again usually limited to 3.6V; thus permitting thin oxide implementation. However in overload conditions where V(INN) is much larger than V(INP), such that I(MP2) is greater than I(MPB2), the source of MNC2 potentially can rise in voltage giving excessive drain-source voltage on MNM2. To overcome this potential problem a clamp circuit is added comprising transistor device MPX, which clamps the drain voltage of MNM2 to a safe voltage during overload to avoid excessive drain-source or drain-gate voltage.

The gate of MPX can be biased to a suitable voltage in a number of ways, for example the bias circuit comprising R3, MNN3, MPC3 and MPB3 shown. I(MPB3) passing through diode connected MNN3 and resistor R3 biases the gate in this example. The voltage is chosen such that MPX turns off in normal operation, but clamps the gate bias voltage of MNM2 low enough to avoid exceeding a predetermined level, given by the maximum recommended operating voltage of the thin oxide transistor, in overload conditions. Note the clamp transistor MPX is normally inactive, so MPX and its bias circuit contribute no noise. MPB1 and MPB2 also contribute some flicker noise, albeit less than the NMOS transistors (MNM1, MNM2) and so can be advantageously made thin oxide.

Figure 4:
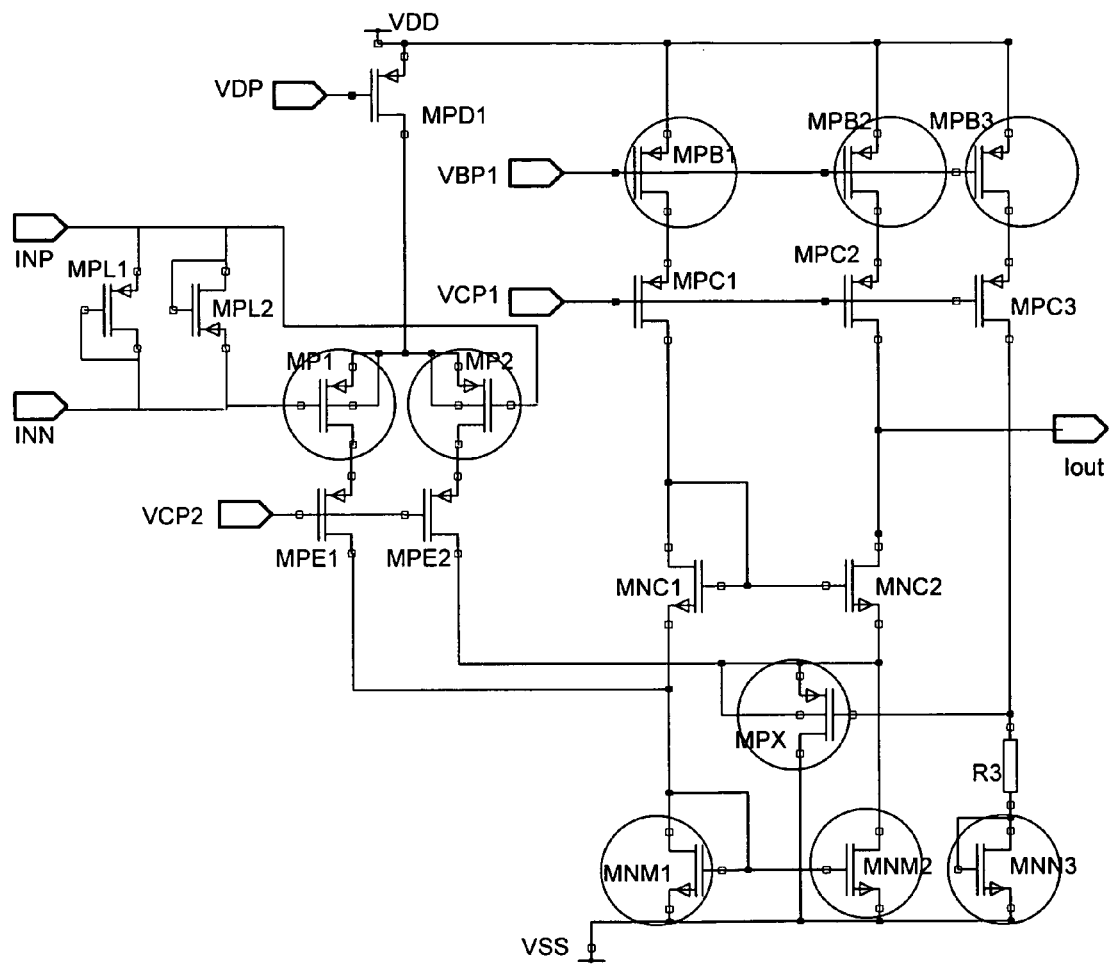
FIG. 4 shows a modified differential folded cascode op amp circuit according to a third embodiment.

In circuits where both input voltages could be guaranteed to stay well below 3.6V, MP1 and MP2 could also be made thin oxide. However this is generally hard to guarantee under all overload or transient conditions. FIG. 4 shows a further alternative op amp circuit according to an embodiment. Here additional input transistor devices MPL1, MPL2, MPE1 and MPE2 are added. Diode-connected devices MPL1 and MPL2 are connected back-to-back in parallel between the gates of the input transistors MP1 and MP2, to limit the input differential voltage, assuming one or both inputs are driven from a significant source impedance (e.g. from feedback resistors around the op amp). Assuming the input voltage applied to the gates is now constrained to a known range, cascode devices MPE1 and MPE2 can be suitably biased and inserted in series with MP1 and MP2 to reduce the maximum drain-source voltage across the input transistors MP1 and MP2.

MPE1 and MPE2 are cascode devices, so will contribute little noise, and clamp devices MPL1 and MPL2 will be off, except during short transients, so will not contribute any noise.

Note that in addition to requiring that the drain-source, gate-drain, and gate-source voltages are less than the rated maximum voltage, e.g. 3.6V, of the thin-oxide transistors, the drain-bulk and source-bulk voltages must also be limited to the rated maximum voltage. In the circuit of FIG. 4, this condition is satisfied since the bulk of MP1 and MP2 is connected to the common source. If the bulk connection was to the positive supply, this condition would be violated for low input voltages, and the device might break down from drain to bulk.

Figure 5:
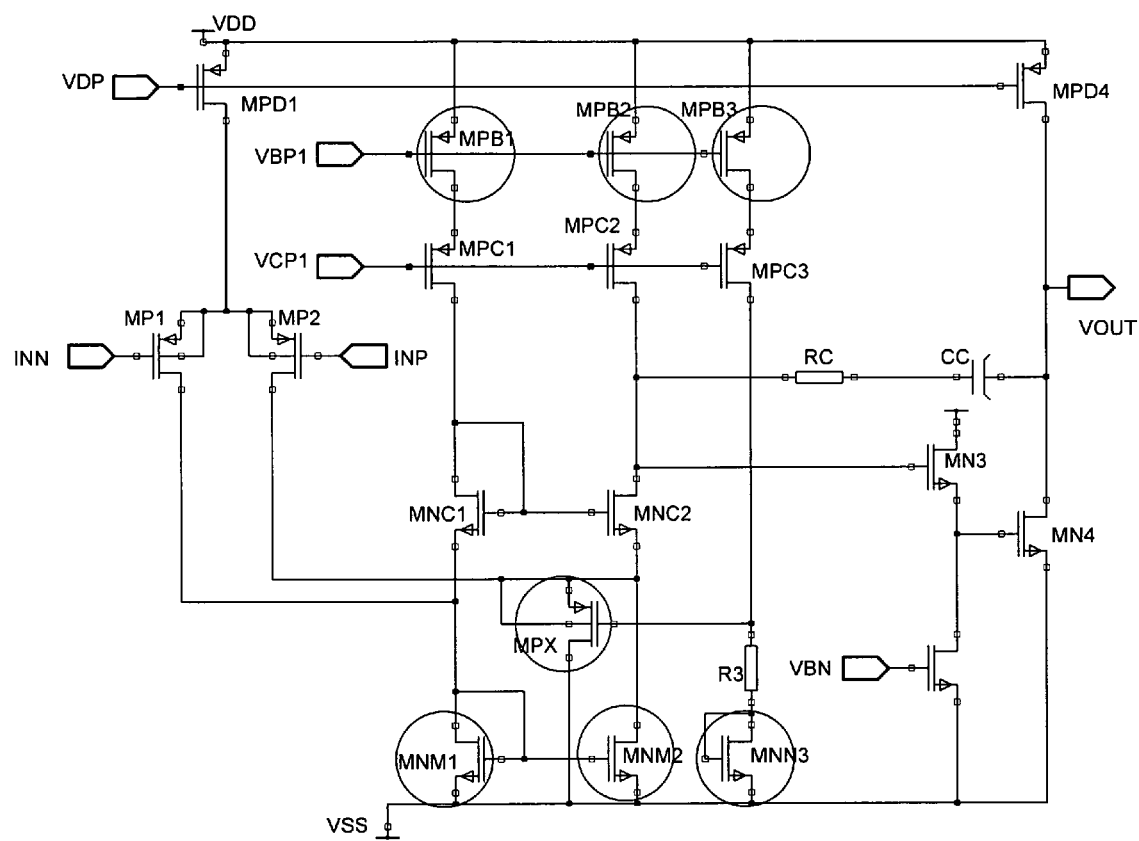
FIG. 5 shows a modified differential folded cascode op amp circuit according to a fourth embodiment.

FIG. 5 shows an enhanced arrangement of FIG. 3, to illustrate the use of this technique in a two-stage amplifier, which additionally includes a conventional class A output stage. The class A gain transistor device MN4 is biased by MPD4, with Miller compensation using resistor RC and capacitor CC, as well as a lever shifter MN3.

These techniques could be equally applied to the amplifier of FIG. 1a with MNM1, MNM2, MPB1 and MPB2 thin oxide. In this case clamps analogous to MPX would need applying to the sources of MNC1 and MNC2. MP1 and MP2 could be made thin-oxide with the addition of MPE1, MPE2, MPL2, MPL1 as above. Similar adaptations could be made to other similar amplifiers.

Though the above has been described to a process with 3.6V and 19.8V transistors available, the concept could obviously be applied to processes with other maximum transistor operating voltages with clamps applied to limit the voltages across thin-oxide transistors to other predetermined voltages.

These analog circuit stages can be used as straightforward audio analog amplifier stages, or combined with digital circuits for example in a digital to analog converter (DAC) or an analog to digital converter (ADC) on a mixed signal integrated circuit. In such an arrangement, the same type of thin oxide transistor devices used in the analog circuit stage may also be implemented in the digital circuit(s).

In principle, the oxide thickness of every noise-contributing transistor could be optimised to minimise flicker noise according to its maximum applied voltage. However each option of oxide thickness requires at least one extra photo mask to be tooled, and one extra photolithographic wafer processing step, and one extra oxide growth wafer processing step, so more than say three different oxide thicknesses becomes expensive in tooling costs and wafer processing costs. Typically just two will be adequate: one for voltage-limited devices, and one for devices which may see the full analog supply voltage.

Figure 6:
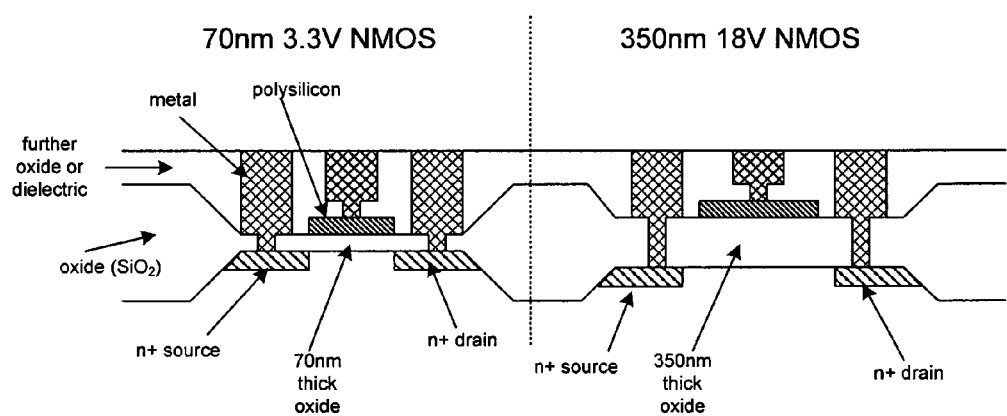
FIG. 6 shows a schematic of an integrated analog circuit comprising two transistor devices having different oxide thicknesses.

FIG. 6 shows schematically two MOS transistor devices in the same analog circuit on an integrated circuit, but with different oxide ($SiO_2$) thicknesses. The oxide layers are not to scale and are merely representative of the above described thick and thin transistor devices. Both devices will be based on a substrate, in the example a p-type substrate. This has two deposits of n-type material to form the source and drain parts of each transistor device. The Silicon Oxide ($SiO_2$) layers at this point are typically thinner than at other parts. The electrical contacts are provided at these thinner regions. Similarly the gate is formed with a contact and a thinning of the oxide layer between the two n type regions.

There is however a difference between the two devices in that the oxide layer is thicker on one device (typically 350 nm) at the thinnest part, between gate and channel, compared with the other device (70 nm at the thinnest part).

While the above circuit configurations are designed to ensure that the thin oxide (eg 70 nm), low voltage devices never see too high a voltage (say greater than 3.6V) during operation, the thin oxide devices inherently make the device less robust to excessive voltages than a circuit composed wholly of thicker-oxide (eg 350 nm), higher-voltage, devices.

In particular, such devices can be sensitive to electrostatic discharge voltages (ESD). There are many practical situations in which integrated circuits can be exposed to the effects of ESD incidents. For example, either during handling of the integrated circuit before or during manufacture of the end-product using the circuit, or by accidental application of ESD spikes by the end-user, such as when attaching cables to outputs of a hi-fi amplifier.

Figure 7:
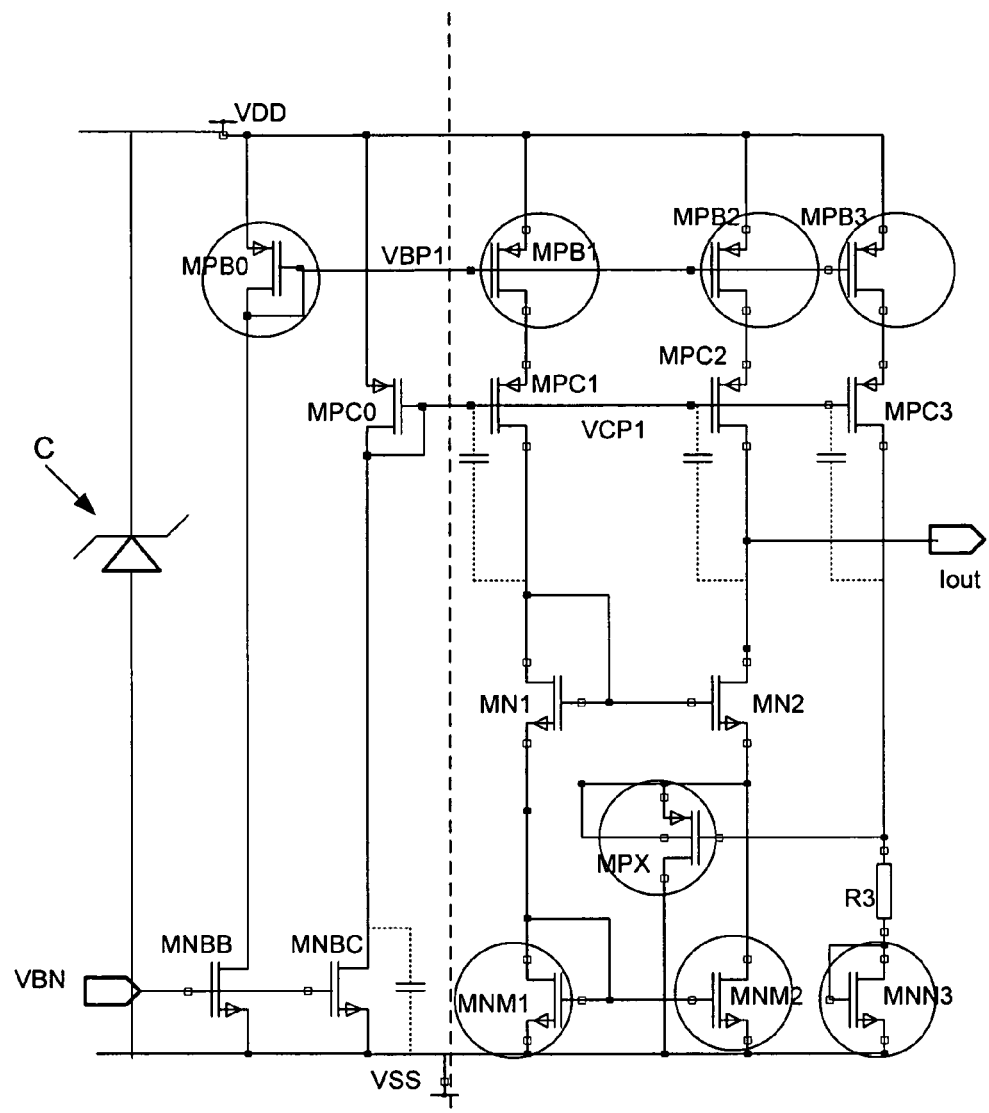
FIG. 7 shows part of the circuit of FIG. 5 with over-voltage protection.

FIG. 7 shows a portion of the circuit of FIG. 5 (without the input and output stages). The additional diode-connected transistors MPB0 and MPC0 shown generate the voltages VBP1 and VCP1, driven by respective NMOS current sources MNBB and MNBC, themselves driven by a suitable applied bias voltage VBN. FIG. 7 also includes a clamping device C, such as a zener diode, to limit the voltage seen by the active circuitry. The clamping device C is connected across the supply rails (VDD and VSS), and is designed to remain high impedance for applied voltages at least up to the maximum specified supply voltage of the chip; but to become low-impedance before the applied voltage is enough to cause destructive breakdown of the components in the active circuitry. This clamping arrangement is thus designed to protect the active devices (especially MPB1-3 and MPC1-3) against damage when an ESD pulse is applied to the supply rail.

This ESD protection strategy is well known and effective for circuits with homogenous (ie all thick oxide) transistors. However for an 18V circuit, where the clamp voltage must be guaranteed to be inactive up to at least 20V, there is still a danger of transient voltages in excess of say 3.6V appearing on the thin-oxide devices, causing damage.

Figure 8:
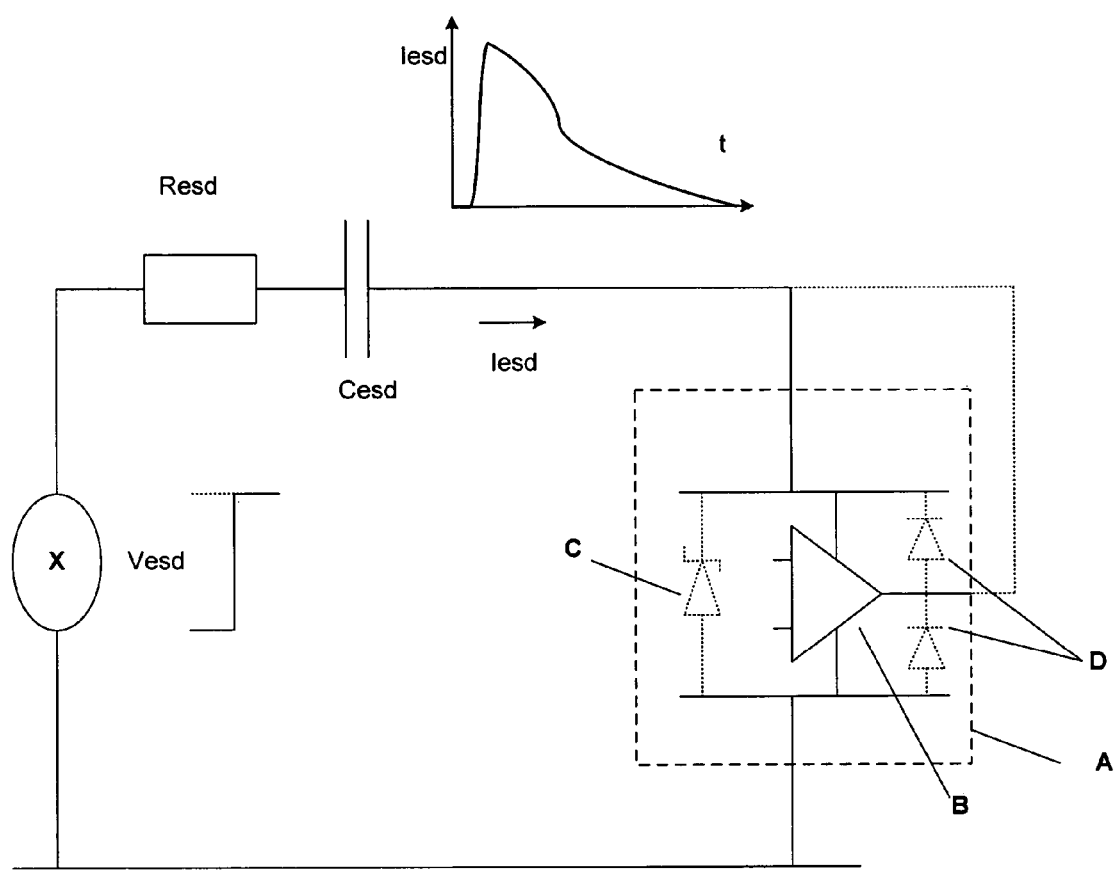
FIG. 8 shows a test arrangement for applying an ESD voltage pulse.

FIG. 8 shows a typical test set-up used to evaluate the sensitivity of a circuit A (in this case the circuit of FIG. 7) to an ESD pulse. A pulse generator X injects a pulse Vesd into the positive supply terminal of the device under test (DUT) A via a small resistor Resd and capacitor Cesd. Typically Vesd may be 2 kV, Resd 1500 ohms and Cesd 200 pf.

Figure 7A:
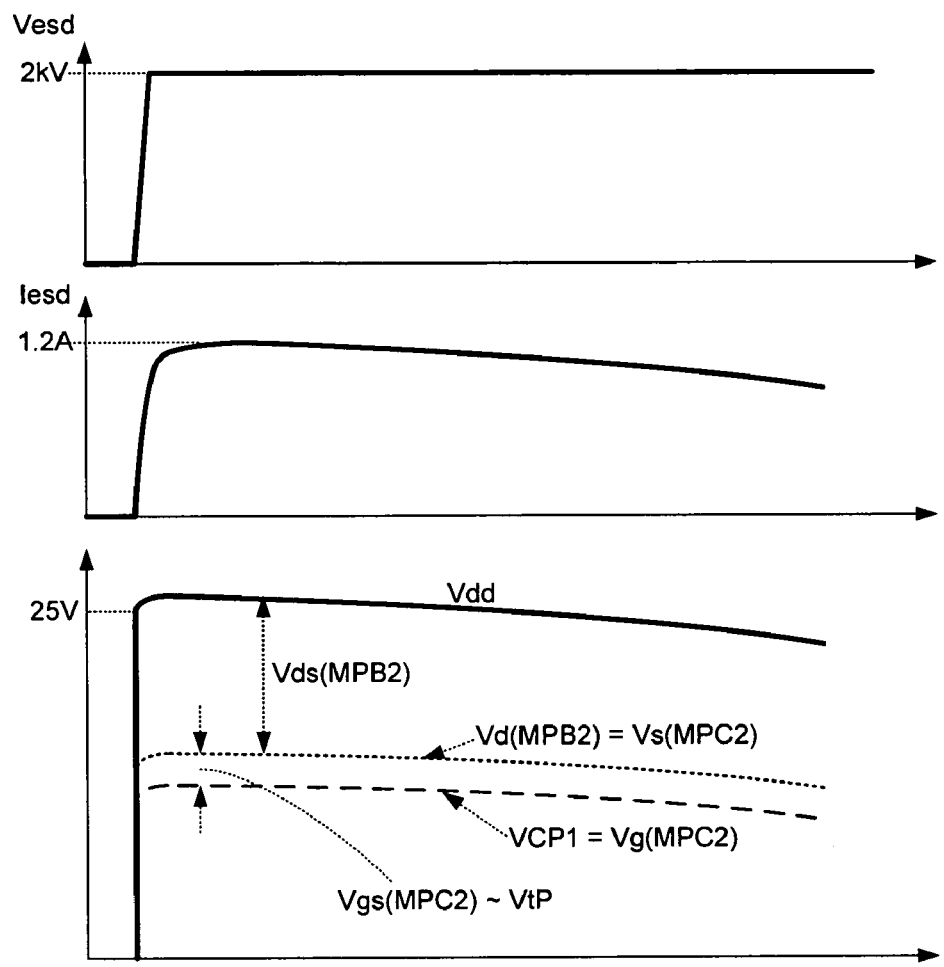
FIG. 7a shows voltage levels at various nodes in the circuit of FIG. 7 following application of an ESD voltage pulse.

Referring again to FIG. 7, before an applied ESD pulse, all nodes in the circuit are discharged to ground voltage. Considering a positive ESD pulse applied to the supply as shown in FIG. 8, the fast positive edge of Vesd then causes the supply rail Vdd to pulse high in a few nanoseconds, rising rapidly until clamped at say 25V by the clamp device (C), as shown in FIG. 7a. Since the rise-time of the applied voltage is of the order of a few nanoseconds, the node voltages in the circuit just after the rise of Vdd are defined mainly by pure capacitive division arising from the various inherent and parasitic capacitances of the devices and interconnects (these are illustrated in dashed outline in FIG. 7). Considering VCP1 in particular, this node has significant parasitic capacitances to ground or other ground-related nodes, including junction capacitance from the drain of MNBC to substrate, and gate-drain overlap capacitances of high-voltage devices MPC1, MPC2, MPC2. Despite other capacitances to Vdd, including the gate-source capacitance of MPC0, VCP1 initially spikes to a voltage well below Vdd, before slowly relaxing towards Vdd as Vdd decreases over a time of more than a hundred nanoseconds. The drains of MPB1, MPB2, MPB3 are coupled tightly to VCP1, since the gate-source capacitances of large, high-voltage devices MPC1, MPC2 and MPC3 is substantially greater than the source-well capacitance of these transistors, and than the parasitic drain-well and drain-gate overlap capacitances of MPB1, MPB2, MPB3 especially once the gate-source voltage increases to a PMOS threshold voltage VtP, and the channel turns on. Thus the drain of MPB1, MPB2, MPB3 tend to track approximately a VtP above VCP1 as shown in FIG. 7a Therefore a high voltage appears across the drain-well and drain-source of the thin oxide devices MPB1, MPB2, MPB3. This can be significantly higher than the normal (say) 3.6V rating, indeed higher than the drain-source breakdown voltage, 6V say, of these thin oxide transistors, and was found experimentally in some cases to cause damage to them, particularly MPB2.

Thus the use of these thin-oxide devices in such a high-voltage circuit can give rise to problems of ESD robustness. These problems would not exist in a purely thick-oxide circuit as the clamp voltage would be low enough to protect the more robust thick oxide higher-voltage devices.

In actual use in the end application, where the device has already been soldered onto a PCB, the device is more likely to see an ESD pulse arrive from an external connection from a plug or socket of the equipment than from the supply rail. As illustrated in FIG. 8, the device will usually have internal diodes D connected between any non-supply pin to steer the ESD current pulse into the supply rails and through the clamp device C, thus again limiting the voltage between the supply rails as above. However the waveform at the supply rails and the internal nodes will be similar to that described above (see FIG. 7a), potentially producing excessive voltages across the thin-oxide devices.

Figure 9:
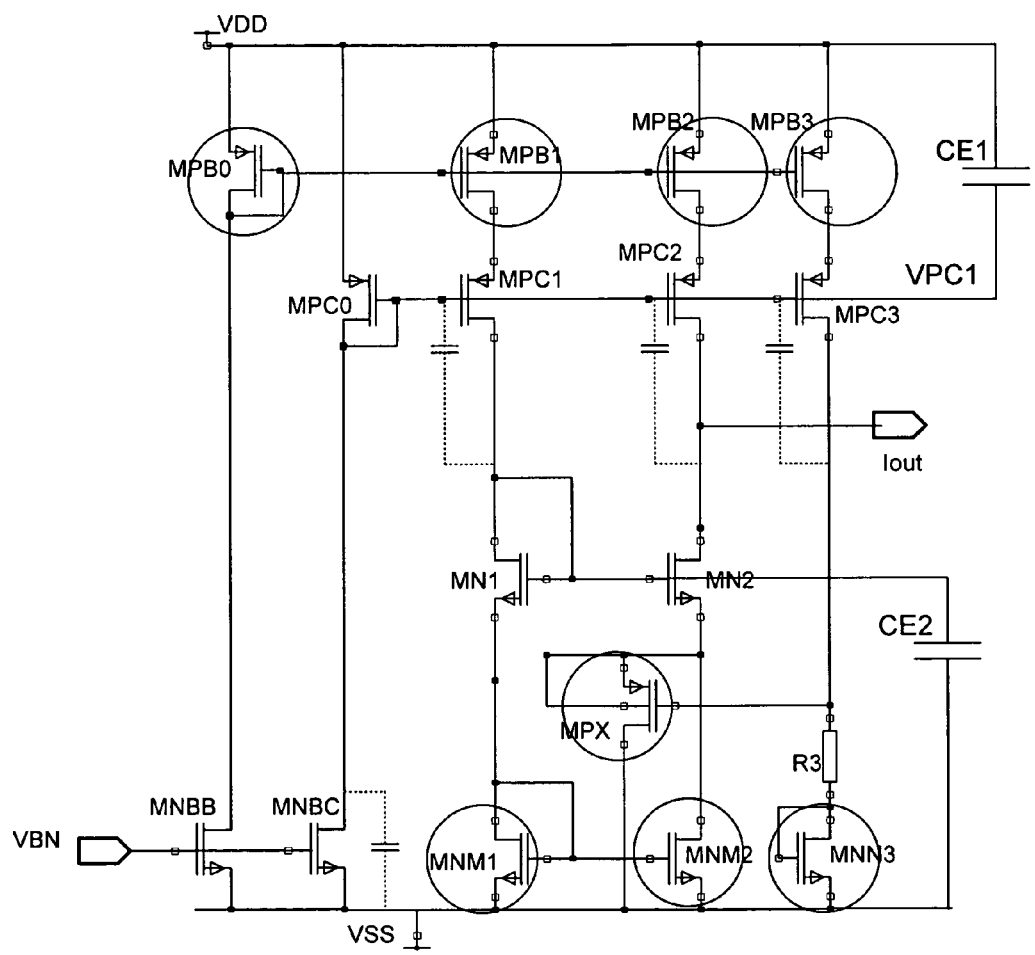
FIG. 9 shows a modified differential folded cascode op amp circuit according to a fifth embodiment which includes ESD protection.
Figure 9A:
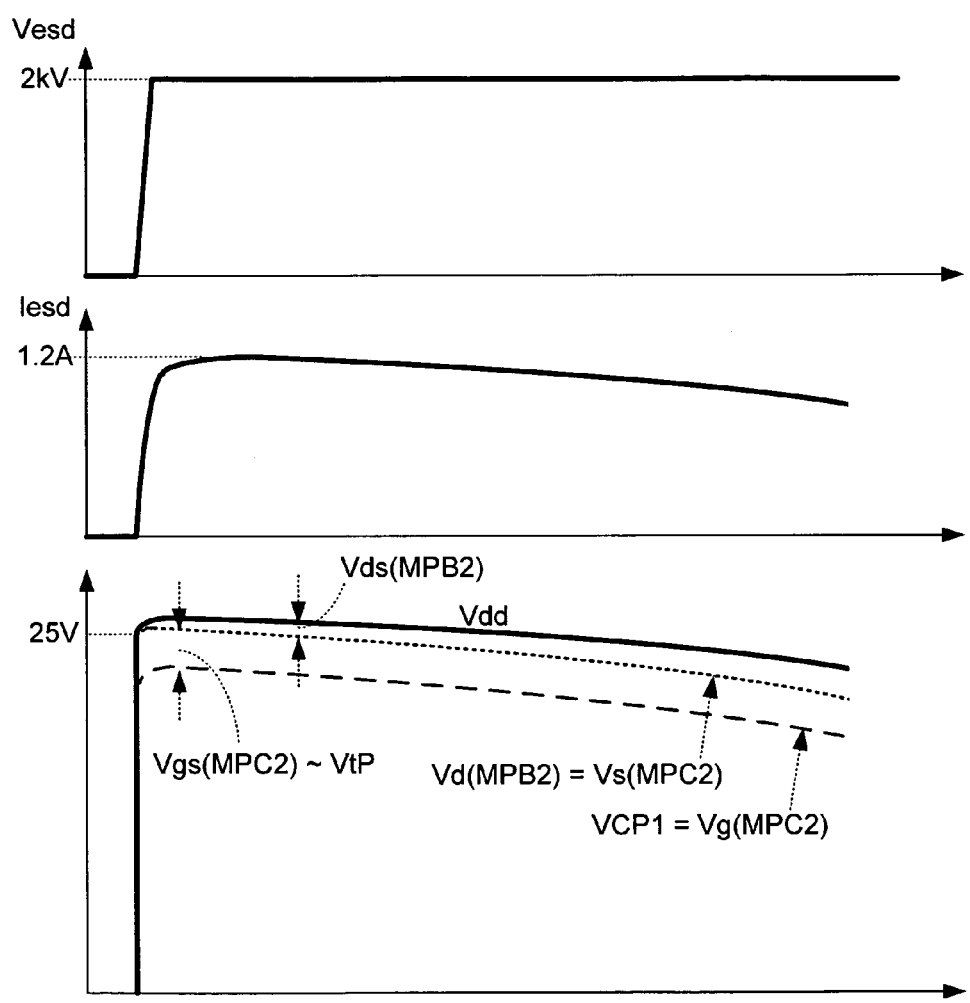
FIG. 9a shows voltage levels at various nodes in the circuit of FIG. 9 following application of an ESD voltage pulse.

FIG. 9 shows a further embodiment incorporating ESD protection for mixed oxide thickness transistor circuits, and is arranged to prevent the above-described transient over-voltage during fast-rise-time ESD pulses. A capacitor CE1 is connected between the cascode gate-bias line VCP1 and Vdd acting as a voltage pulse protection means. This is sized relative to other device and parasitic capacitances on this node, according to standard methods available in the art, so that capacitive division of the clamp voltage step appearing across Vdd to Vss (say 25V) reduces the peak voltage across MPC0, to for example a voltage equal to VtP, or perhaps a volt or so greater, (or some other value that can be tolerated by the thin oxide devices) to give waveforms as shown in FIG. 9a. In this way, the maximum drain-source voltage of MPC1, MPC2, MPC3 is reduced to zero or at most a volt or so, as the respective drains will still tend to track at a voltage a VtP or so above VCP1.

In principle, the sizing of CE1 could be performed by calculation of all the parasitic capacitances to Vdd and Vss and calculation of the minimum capacitance CE1 required, but in practice, the voltage dependencies and series-parallel connections of the capacitances involved make it more likely in practice to be performed by iterating computer circuit simulations based on a first estimate obtained by gross simplification of the network.

Also in principle a slightly higher voltage across MPB1-3 could be tolerated, so a slightly smaller value of CE1 could be used. But in practical examples of this circuit, CE1 is small compared to other components of the circuit, only 10% of the size of the op amp compensation capacitor, and some extra margin is desirable to allow for other effects due to stray inductances for example, that are hard to predict, so CE1 may be designed larger than the minimum predicted to be adequate.

Capacitor CE1 would normally be a polysilicon-insulator-polysilicon (PiP) or MiM (metal-insulator-metal) capacitor structure similar to that used for the op amp compensation capacitor. However other voltage pulse protection means could be used instead of capacitor CE1, for example a big reverse-biased junction diode or two stacked MOS diodes. However since the initial transient voltages are defined by capacitor division, these are still effectively acting as capacitors.

In each case, these protection devices operate to effectively short circuit the first fast rising part of the clamped ESD waveform on the supply rail (eg VDD), to which the thin oxide transistors are connected, to the other side of these transistors such that the voltage across these devices remains largely unaffected by the ESD pulse; and thus these devices are not damaged by an otherwise large overvoltage effect.

Further alternative protection arrangements might include a breakdown structure, such as a zener diode of appropriate breakdown voltage. But such structures are not available or characterised on standard CMOS processes.

Alternatively a specially laid out large thin-gate PMOS (for example a PMOS with gate and source=Vdd, drain=VCP1, with large width and salicide blocking used to ballast the drain and source), which would breakdown "first" but be more robust could be used in place of CE1. But the area of such a structure would be larger than the capacitor CE1.

Another alternative is to connect the voltage pulse protection means, for example one or more capacitors directly across the drain-source of the devices involved (eg MPB1-3). However the total capacitance involved would be similar.

The single capacitor option shown in FIG. 9 is however preferred because using capacitors directly across the transistor devices will cause in normal operation, the sources of cascode transistors MPC1-3 to be a.c. grounded at high frequencies, causing a large contribution to high-frequency thermal noise from these cascode transistors and also introducing h.f. zeros into the impedance of the cascoded nodes at their drains.

A similar arrangement is used to protect thin oxide devices MNM1-3 and MPX. In particular, capacitor CE2 is coupled between supply rail VSS and the gates of MN1 and MN2. This effectively provides a brief short circuit for the fast rising initial part of the ESD waveform so that this is not presented across these thin oxide devices. The effect of ESD is not as severe for these devices due to parasitic capacitances to the supply rail VSS and so a smaller capacitance can be used Clamp device C has been referred to as a zener diode: other structures such as short thick-field transistors and grounded-gate MOS transistors are well-known alternatives.

The skilled person will recognise that the above-described apparatus and methods may be embodied as processor control code, for example on a carrier medium such as a disk, CD- or DVD-ROM, programmed memory such as read only memory (Firmware), or on a data carrier such as an optical or electrical signal carrier. For many applications embodiments of the invention could be implemented on a FPGA (Field Programmable Gate Array). Thus the code may comprise for example code for setting up or controlling an FPGA. The code may also comprise code for dynamically configuring re-configurable apparatus such as re-programmable transistor arrays. Similarly the code may comprise code for a hardware description language such as Verilog™ or VHDL (Very high speed integrated circuit Hardware Description Language) which could be used as input to analog circuit synthesis software. Or analog circuit synthesis software could be written or configured to select appropriate transistors in synthesised amplifiers to be thin-oxide. As the skilled person will appreciate, the code may be distributed between a plurality of coupled components in communication with one another. Where appropriate, the embodiments may also be implemented using code running on a field-(re)programmable analog array or similar device in order to configure analog hardware.

The skilled person will also appreciate that the various embodiments and specific features described with respect to them could be freely combined with the other embodiments or their specifically described features in general accordance with the above teaching. The skilled person will also recognise that various alterations and modifications can be made to specific examples described without departing from the scope of the appended claims.

What is claimed is:

1. An analog circuit for processing analog signals in an integrated circuit comprising a number of metal oxide semiconductor transistor devices, the circuit comprising: a first said transistor device having a first oxide thickness and arranged in use to have an operating voltage below a predetermined level; a second said transistor device having a greater oxide thickness and arranged such that in use it is not constrained by the predetermined operating voltage level; and voltage pulse protection means arranged to substantially maintain said operating voltage in the presence of a rapidly rising voltage waveform applied to the first transistor device.

2. A circuit according to claim 1, wherein the voltage pulse protection means is a discrete device coupled across the first transistor device.

3. A circuit according to claim 2, wherein the discrete device is a capacitor.

4. A circuit according to claim 2, wherein the voltage pulse protection means is coupled across the first transistor device to the gate connection of the second transistor device.

5. A circuit according to claim 1, comprising a plurality of first and second transistor devices each arranged into a circuit stage and each comprising a voltage pulse protection means coupled across said respective first transistor device.

6. A circuit according to claim 1, wherein the predetermined operating voltage level is 3.6V and the first oxide thickness is 70 nm.

7. A circuit according to claim 1, wherein the second transistor device forms part of a cascode transistor device circuit within said analog circuit.

8. A circuit according to claim 7, wherein the cascode transistor device circuit is a differential folded cascode op amp circuit.

9. A circuit according to claim 8, wherein the op amp circuit further comprises input, bias, current mirror and constant current sub-circuits and wherein said first transistor device forms part of one of said op amp sub-circuits.

10. A circuit according to claim 1, further comprising a clamp circuit arranged to limit the operating voltage of said first transistor to the predetermined operating voltage level.

11. A mixed signal integrated circuit, comprising an analog circuit according to claim 1.

12. A method of processing an analog signal, comprising applying the analog signal to an analog circuit for processing analog signals in an integrated circuit comprising a number of metal oxide semiconductor transistor devices, the analog circuit comprising a first said transistor device having a first oxide thickness, and a second said transistor device having a greater oxide thickness, such that the analog signal is processed by both said transistor devices; wherein the first transistor device is arranged to have an operating voltage below a predetermined level and wherein the second transistor device is arranged such that it is not constrained by the predetermined operating voltage level; and wherein a voltage pulse protection means is arranged to substantially maintain said operating voltage in the presence of a rapidly rising voltage waveform applied to the first transistor device.

13. A method according to claim 12, wherein the voltage pulse protection means is a discrete device coupled across the first transistor device.

14. A method according to claim 13, wherein the discrete device is a capacitor.

15. A method according to claim 12, wherein the second transistor device forms part of a cascode transistor device circuit within said analog circuit.

16. A method according to claim 13, wherein the second transistor device forms part of a cascode transistor device circuit within said analog circuit.

17. A method according to claim 14, wherein the second transistor device forms part of a cascode transistor device circuit within said analog circuit.

18. A circuit according to claim 3, wherein the voltage pulse protection means is coupled across the first transistor device to the gate connection of the second transistor device.

* * * * *